United States Patent
Shih et al.

(10) Patent No.: US 8,042,248 B2
(45) Date of Patent: Oct. 25, 2011

(54) LOW COST WINDOW PRODUCTION FOR HERMETICALLY SEALED OPTICAL PACKAGES

(75) Inventors: Wei-Yan Shih, Plano, TX (US); Bradley M. Haskett, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1034 days.

(21) Appl. No.: 11/536,857

(22) Filed: Sep. 29, 2006

(65) Prior Publication Data
US 2008/0080077 A1    Apr. 3, 2008

(51) Int. Cl.
*B23P 17/00* (2006.01)
(52) U.S. Cl. .................. 29/414; 438/116; 359/514
(58) Field of Classification Search ........... 52/204.5; 29/414, 417, 527.2, 530; 438/116, 121, 124, 438/127; 65/36, 59.4, 59.7, 59.1; 257/678, 257/730, 704, 710, 794; 359/507, 511, 513, 359/514, 904
See application file for complete search history.

(56) References Cited

U.S. PATENT DOCUMENTS

| | | | |
|---|---|---|---|
| 5,355,569 A * | 10/1994 | Marek et al. ................. 29/25.41 |
| 6,745,449 B2 * | 6/2004 | Hanna et al. .................... 29/458 |
| 6,947,568 B2 * | 9/2005 | Tanabe et al. ................ 381/174 |
| 6,988,338 B1 * | 1/2006 | Chen et al. ................... 52/171.1 |
| 7,476,961 B2 * | 1/2009 | Haskett et al. ................ 257/680 |
| 7,576,427 B2 * | 8/2009 | Potter ........................... 257/710 |
| 2003/0213124 A1 * | 11/2003 | Chuang et al. ................. 29/854 |
| 2004/0217151 A1 * | 11/2004 | Hanna et al. .................. 228/219 |
| 2006/0107518 A1 * | 5/2006 | Misawa et al. .............. 29/592.1 |

* cited by examiner

*Primary Examiner* — David Bryant
*Assistant Examiner* — Christopher Koehler
(74) *Attorney, Agent, or Firm* — Charles A. Brill; Wade James Brady, III; Frederick J. Telecky, Jr.

(57) ABSTRACT

Disclosed embodiments demonstrate batch processing methods for producing optical windows for micro-devices. The windows protect the active elements of the micro-device from contaminants, while allowing light to pass into and out of the hermetically sealed micro-device package. Windows may be batch produced, reducing the cost of production, by fusing multiple metal frames to a single sheet of glass. In order to allow windows to be welded atop packages, disclosed embodiments keep a lip of metal without any glass after the metal frames are fused to the sheet of glass. Several techniques may accomplish this goal, including grinding grooves in the glass to provide a gap that prevents fusion of the glass to the metal frames along the outside edges in order to form a lip. The disclosed batch processing techniques may allow for more efficient window production, taking advantage of the economy of scale.

11 Claims, 3 Drawing Sheets

LOW COST WINDOW PRODUCTION FOR HERMETICALLY SEALED OPTICAL PACKAGES

FIELD OF THE INVENTION

The disclosed embodiments relate generally to packages for various micro-devices, such as photonic devices, optical devices, and micro-electromechanical system ("MEMS") devices, and more specifically to housing these sorts of devices within a package that provides a hermetically sealed chamber with a transparent window that allows for transmission of light and/or other electromagnetic wavelengths.

BACKGROUND OF THE INVENTION

Many micro-devices require optical access. Some micro-devices, such as digital micromirrors, need optical access in order to function, since light must be able to interact with the active elements of these micro-devices in order to achieve the desired results. By way of example, light must be able to enter and leave a digital micromirror device ("DMD") in order to be reflected by the micromirror elements for image projection. For other micro-devices, optical access may be needed for inspection purposes. Regardless of the reason, there is a need for optical access in many micro-devices.

On the other hand, the active elements of such micro-devices may be fairly fragile, needing protection from environmental contamination in order to operate effectively and reliably. Due to the extremely small size of the active elements within micro-devices, even dust particles may interfere with proper functioning. Thus, there is a need to shield the active elements of micro-devices from any contamination or environmental factors that might detrimentally impact their operation.

The active elements of micro-devices are often housed within a package that is hermetically sealed, but which provides a transparent window in the cover allowing optical access. The window can allow for visual inspection of the active elements within the micro-device, and can also be configured to allow visual light or any other specific range of electromagnetic wavelengths to enter into and/or leave the micro-device. So in many digital micro-devices, such as DMDs, windows serve a crucial role by allowing the transfer of light for the operation of the device, while sheltering the active elements of the micro-device from environmental contaminants that might hinder performance.

FIG. 1 provides an example of a typical optical MEMS window, which to date have been constructed one at a time. Such optical MEMS windows affix glass within a metal frame. Typically, the metal frame is formed having an aperture for the transparent window and a lip or flange surrounding the aperture that can serve as a location for anchoring the window upon a package. Glass is then fused to the metal frame in order to form the overall window structure. The heat involved in this fusing process tends to ruin the surface finish of the glass, however, requiring grinding and/or polishing of both sides of the glass to provide a useful window. Then, the transparent window is typically treated with anti-reflective coatings. The entire window is then mounted to the package for the micro-device. Typically the metal frame for the optical MEMS window is welded in place in order to hermetically seal the active elements of the micro-device within the package beneath the window.

While these traditional optical MEMS windows function quite well, they are fairly costly to produce, requiring multiple steps to manufacture each separate window. Since each of the process steps, which tend to be relatively time and labor intensive, is performed for each individual window, the cost of each window is driven up. The high cost of production for these traditional windows adds to the overall cost of each MEMS device. Accordingly, there is a need for a production process for windows that would reduce their costs.

SUMMARY OF THE INVENTION

Using mass production techniques, such as batch processing, offers the possibility of lowering the per unit cost of each window by taking advantage of the economy of scale. Since several steps in the window manufacturing process can be performed on multiple windows at once, it may be possible to improve production efficiency and thereby lower the per unit cost. The methods disclosed below are designed to improve the window production process by adapting the process to employ such mass production techniques. It should be noted that any reference to a DMD is intended as an exemplary reference to an optical MEMS device; all optical MEMS devices are included within the scope of the term DMD.

This goal can be accomplished by developing an effective system for producing several windows simultaneously. While several alternative process systems are described herein, they tend to share some basic attributes. An exemplary batch window production process follows. First, metal frames would be stamped out of sheet metal. The metal frames could be formed one at a time, stamping individual frames with an aperture and a surrounding lip out of sheet metal and then aggregating several frames within a grid for the remaining steps of the window manufacturing process, or several frames could be stamped out of a single sheet of metal, forming a sheet with a multitude of apertures representing several frames. Alternatively, the metal frames could be formed using a variety of different techniques, such as depositing metal directly onto the glass surface, for example. Regardless, the end result is a grid-like structure in which several frames are arranged together.

A sheet of glass sufficiently large to span all of the frames (so as to cover all of the apertures of the various metal frames) would then be fused to the metal frames. Using a large sheet of glass to span several frames simultaneously allows for a single fusing process to create multiple window units. Once the glass is fused to the metal frames, forming a hermetic seal between the two elements of the windows, the entire glass sheet would be polished on both sides to provide the necessary optical qualities for light transmission. Thus, a single polishing step may address a multitude of windows simultaneously. Any desired coatings, such as anti-reflective or anti-refractive coatings for the glass or gold plating for the metal frames, may then be applied simultaneously to all of the windows in the grid. Then the individual windows may be cut from the grid, cleaned, and a protective cover may be applied to shield the windows from possible damage during shipping and handling.

Such techniques allows several steps of the manufacturing process to be performed simultaneously for multiple windows, thereby reducing the time and labor necessary to produce each window. Disclosed embodiments typically employ a process that ensures that any windows formed will provide a lip around the outside of the frame without glass. Creating an all-metal lip around each of the multiple windows provides a metal-only frame surface so that each window may be welded in place on the package.

There are several possible techniques to provide a metal lip around the outside of each frame. For example, grooves could be cut into the sheet of glass initially, so that during the fusing process the groove would provide an air gap separating the glass surface from the metal frame, thereby preventing fusion of at least some portion of the metal frame lip to the glass. Another alternative would be to place some shield material, such as an inert salt or graphite spacers, between the glass and the metal frame in order to prevent the two from fusing together. This fusion resistant material could also be placed within grooves cut in the glass, in order to maximize the effectiveness of the combined techniques. Alternatively, the glass sheet and metal frames could be fused together without taking any pre-fusion steps that might provide an all-metal lip, and then such a lip could be formed at a later stage in the process by removing strips of glass to form all-metal lips around the various windows within the grid.

While there are several possible techniques that could ensure a metal (non glass) lip for each window, one of these techniques will be used when batch processing several windows at once in order to provide effective windows that can be mounted upon a micro-device package in accordance with described embodiments. It may even be possible to batch weld the multiple window covers in place atop a series of micro-device packages, further improving the efficiency of the production process. Such a window production process may be more efficient because it may eliminate certain steps within the traditional process (since for example, glass rounding and machining metal window frames individually may no longer be needed), as well as performing several steps on batches of windows simultaneously.

BRIEF DESCRIPTION OF THE DRAWINGS

Reference is made to the figures below.

DETAILED DESCRIPTION OF THE EMBODIMENTS

Figure 1:
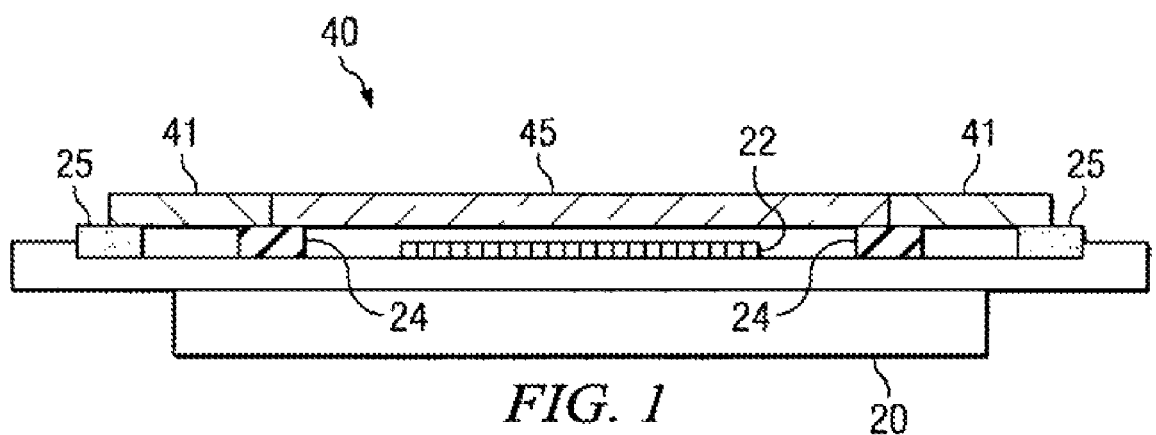
FIG. 1 is a cross-sectional illustration of an exemplary DMD package with a transparent window hermetically sealing the package.

The disclosed embodiments relate to methods for manufacturing windows for micro-devices using batch processing techniques to improve efficiency. While disclosed embodiments relate broadly to optical MEMS devices, the specific examples set forth in the figures below may illustrate DMD packages. Thus, any reference to DMD is intended to broadly include all optical MEMS devices. FIG. 1 shows a typical DMD package 20 with a window 40 hermetically sealing the package 20 to protect the active elements of the DMD 22 from contamination or other environmental factors that might reduce operational effectiveness. While these windows 40 have previously been constructed one at a time, the embodiments disclosed below provide a more cost-effective batch processing technique that allows for steps of the manufacturing process to be performed simultaneously upon multiple windows.

Figure 2:
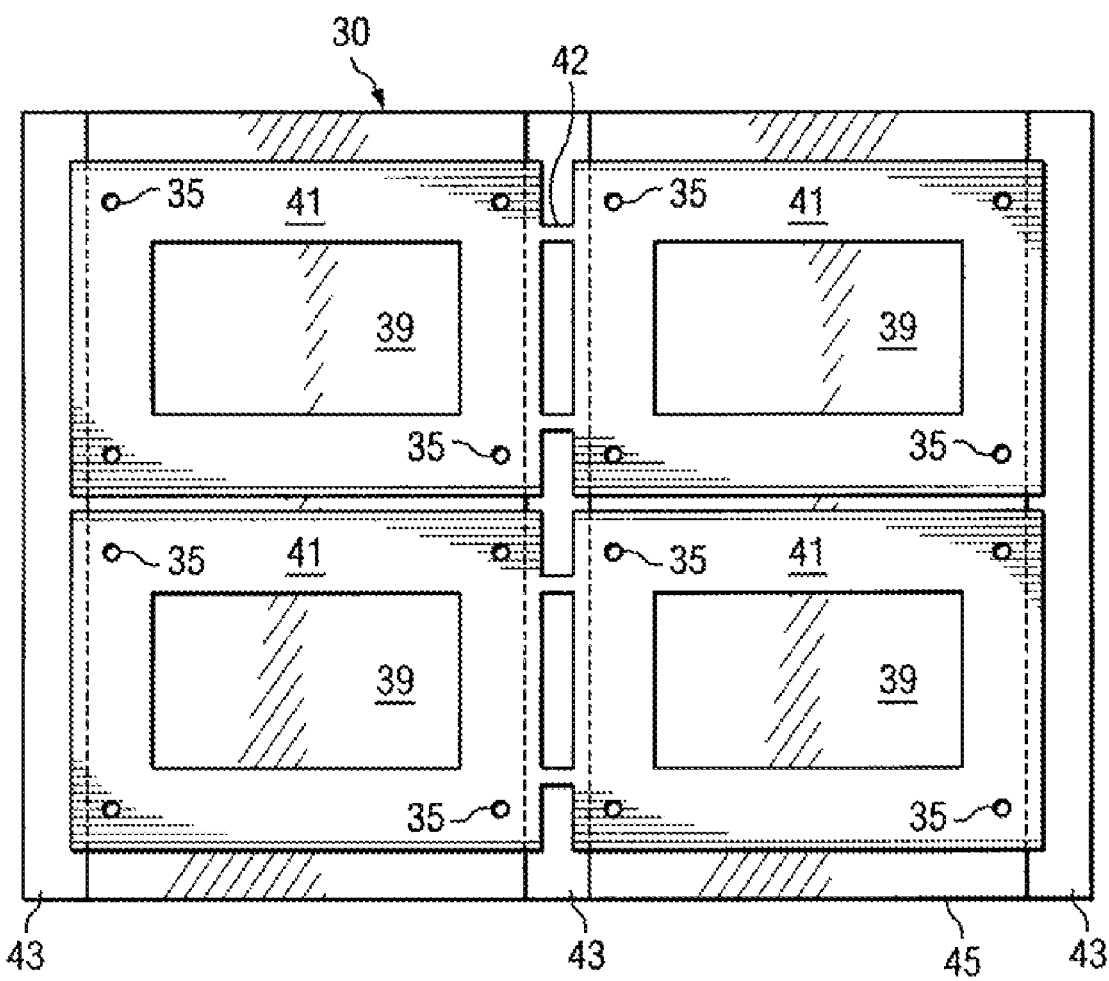
FIG. 2 is a plan view showing the array of multiple frames in place with relation to the sheet of glass in preparation for fusing as part of a batch process for creating windows.
Figure 3:
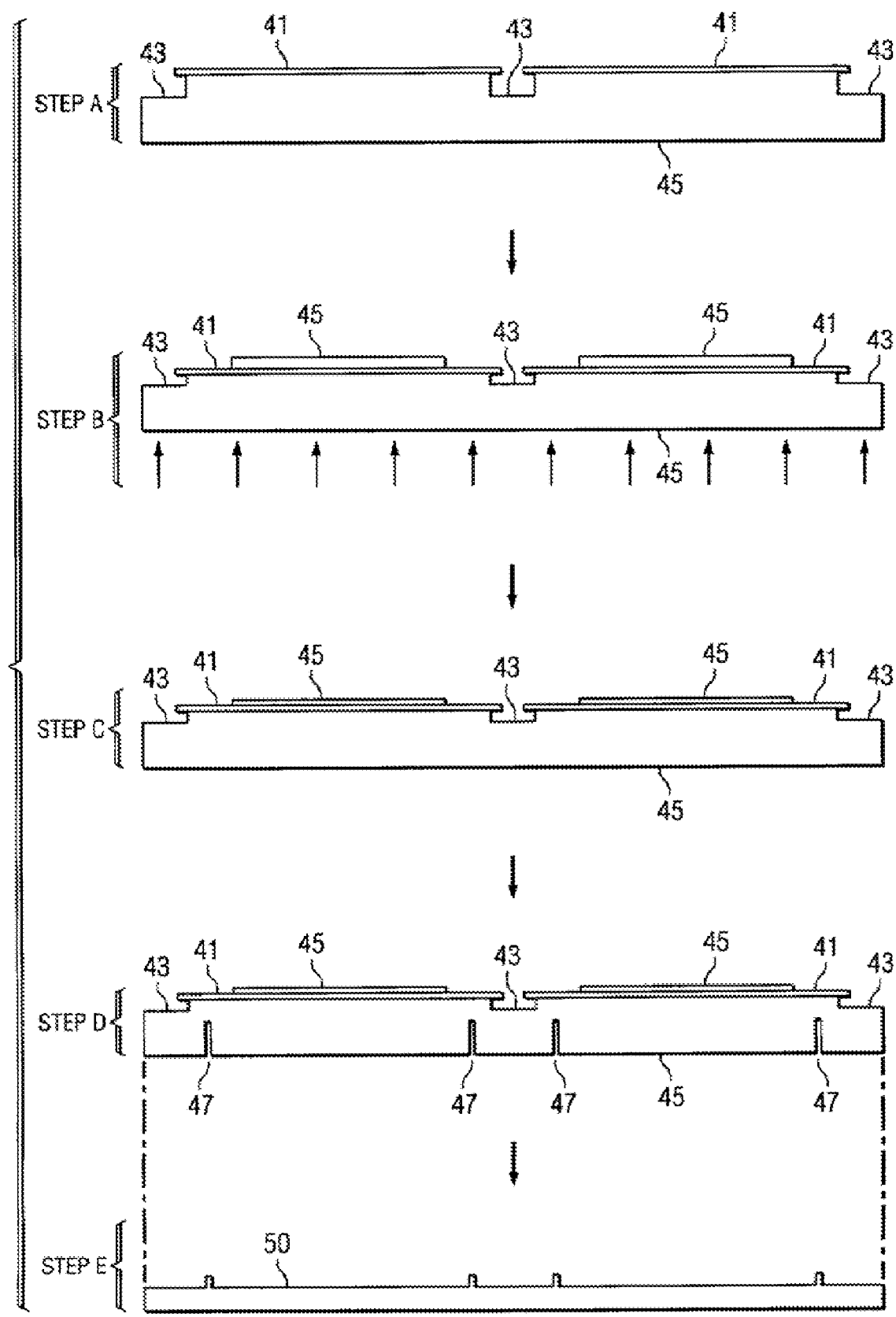
FIG. 3 is a schematic diagram illustrating an exemplary process flow with steps A-E for one of the embodiments that may be used to batch process windows, using side views of the array of frames in relation to the sheet of glass to illustrate the process.

The basic physical elements that come together in this process in order to simultaneously form multiple windows 40 include a plurality of metal frames 41 and a large sheet of glass 45. By fusing these elements together, it is possible to create hermetically sealed windows 40. FIGS. 2 and 3 generally illustrates the process flow for one of the disclosed embodiments. The first step in the disclosed batch manufacturing process would be to form one or more metal frames 41. FIG. 2 demonstrates this first step, illustrating multiple frames 41 of the type that might be simultaneously processed. Typically, frames are stamped out of a thin metal sheet, and are formed to have an aperture 39 with a surrounding metal lip/flange around the circumference of the aperture 39, as shown in FIG. 2. Alternatively, frames could be formed by depositing powdered metal onto a surface (such as a sheet of glass), or by a process that uses some combination of stamping, forming, forging, and/or coining of a thicker metal sheet. Or frames could be etched using a process similar to that used in lead-frame manufacturing.

In selecting materials for the metal frame 41, it is important to try to match the coefficient of thermal expansion of the metal frame 41 closely with that of the glass 45 for the window 40. Accordingly, the frame 41 may be made of Kovar alloy (approximately 29% Ni/54% Fe/17% Co), so that the seal between the metal frame 41 and the glass 45 will retain its integrity despite temperature changes, due to the similarity of the coefficients of thermal expansion. And in this frame formation stage, stamping the frame(s) 41 out of thin metal sheets may also serve to prevent glass-to-metal seal failure due to thermal stresses. If this is a concern, then it may be useful to stamp the frames 41 out of a sheet of metal sufficiently thin so that the stress at the glass-to-metal interface will be minimized in the presence of thermal exposure. By way of example, the frames 41 may be stamped out of a sheet of metal less than approximately 0.8 millimeters thick. Alternatively, a stress relief feature, such as a wavy surface, may be stamped upon the metal frame 41.

The metal frames 41 may be formed one at a time, stamping individual frames having an aperture 39 with a surrounding metal lip around the circumference of the aperture 39 out of sheet metal and then aggregating several frames 41 within a grid or array structure 30 so that multiple frames 41 may be processed simultaneously for the remaining steps of the window manufacturing process. If individual metal frames 41 are to be processed together, they should be arranged in a pattern so that they may be treated as a whole unit. Such a grouping of frames 41 may be held in place so that their relative positions are fixed. By way of example, each frame 41 could be locked in place on a conveyor belt using a mechanical interlock system 35. Alternatively, the frames 41 may be formed with connector elements 42 linking individual frames 41, holding multiple frames 41 together in a grid-like structure 30. By holding the frames 41 together, the risk of a bent flange may be reduced. Or, several frames 41 may be stamped out of a single sheet of metal, forming a sheet with a multitude of apertures 39 representing several frames 41 in one, unified piece. Regardless, the end result is a grid-like structure 30 in which several frames are arranged together in a designated pattern, as illustrated in FIG. 2.

In order to effectively form windows 40 that can be mounted atop DMD packages 20, the metal frame 41 of the window 40 should have a lip around the outside edge that does not have glass on either side. Stated another way, at least a portion of the lip of the metal frame surrounding the aperture should not have glass fused to it (during the process when the glass sheet is fused to the plurality of metal frames). This is important because finished windows 40 are typically seam welded onto the package 20, as shown in FIG. 1. In order to form an effective weld 25 (which may hermetically seal the window 40 atop the package 20), there should be direct contact between the metal of the frame 41 of the window and the package 20; there should be no glass separating the lip of the metal frame 41 from the package 20. In addition, the opposite (upper) side of the lip of the metal frame 41 of the window 40 should also have no glass, allowing convenient access for welding.

There are several possible techniques that could provide such a metal lip (without glass covering it on either side) around the window 40, and several of these techniques require some form of pre-processing of the glass sheet 45 (prior to the glass sheet 45 being fused to the metal frames 41). For example, grooves 43 could be cut or ground into the sheet of glass 45 initially, corresponding to the location of the metal frames 41 within the grid 30, so that during the fusing process the grooves 43 would serve to provide an air gap separating the glass surface 45 from the metal frame 41 (thus preventing fusion of the glass 45 to the metal frame 41 along the outside edges of the frame 41). By forming grooves in the glass sheet corresponding to the position of at least a portion of the lip of each of the metal frames, glass may be prevented from fusing to at least this portion of each metal frame. With both sides of the lip free of glass, the window may later be effectively welded to the package.

This type of groove 43 can be seen in Steps A and B of FIG. 3. As this figure demonstrates, grooves 43 would often be pre-cut or ground into the glass sheet 45, so that they would correspond to the edges of the metal frames 41 within the grid 30. In addition to such mechanical processes, grooves 43 may be formed using chemical processes, such as etching. Alternatively, the sheet of glass 45 could be molded when formed in such a way as to have appropriately placed grooves 43. Step B of FIG. 3 illustrates that the grooves 43 prevent contact between the edges of the metal frames 41 and the glass sheet 45 during the fusing process. By comparing Steps A and B of FIG. 3, the lack of a shared surface interface can be seen; the size of the gap provided by the grooves 43 may shrink as the glass sheet 45 is fused to the metal frames 41, but the gap nevertheless remains to prevent fusion along the outside edges of the frames 41.

Rather than forming grooves in the glass sheet 45, it may also be possible to form grooves in the metal frames 41. Another alternative would be to place some non-fusing shield material, such as an inert salt or graphite spacers, between the glass 45 and the metal frames 41 at the appropriate locations on the metal frames 41 in order to prevent the two surfaces from fusing together on at least a portion of the lip of each metal frame. Examples of such fusion resistant materials would include by way of example gypsum, MgO, or graphite spacers. Alternatively, this fusion resistant material could be placed within grooves 43 cut or ground into the glass or frames (as described above). Another possible option would be to coat the edge of the frame 41 with a thin layer of material that would prevent bonding of glass to that portion of the frame 41. Or, during the metal oxidation process (which is a necessary preliminary step for glass-to-metal fusing), these portions of the frame 41 could be prevented from oxidizing. Regardless, if glass is prevented from bonding to the edges of the metal frames 41, it may be possible to make cuts 47 in the glass and then break the undesirable glass away, exposing a metal flange.

The glass sheet 45 and metal frames 41 could also be fused together without taking any extra pre-fusion steps (that might prevent at least a portion of the lip of each metal frame from fusing to the glass), and then an all-metal lip could be formed at a later stage in the process by removing strips of glass in the appropriate locations along the outside edges of the frames to form all-metal lips around the various windows 40 within the grid 30. By way of example, strips of glass could be ground away to provide a metal lip for each frame 41 (that may serve as a contact point for welding to the package 20).

The present specification is the first to describe pre- or post-fusion steps for creating an all-metal lip around each frame 41, particularly in the context of the use of a single large sheet of glass 45 across a plurality of metal frames 41 to form multiple windows 40 at once. In a batch process such as the one disclosed below, forming an all-metal lip around each metal frame 41 helps to ensure that a good seam weld can hold the window 40 in place on the package 20.

Once pre-processing has taken place, the sheet of glass 45 would be fused to the frames 41, as illustrated in Step B of FIG. 3. A sheet of glass 45 sufficiently large to span all of the frames 41 within a grid-like array structure 30 (so as to cover all of the apertures 39 of the various metal frames 41) would be fused to the metal frames 41 in order to create a hermetically sealed joint between the glass 45 and the metal frames 41. By way of example, the sheet of glass may be Corning 7056 glass. An exemplary technique for fusing such a glass sheet 45 and the metal frames 41 would be to place both the frames 41 and the sheet of glass 45 within a furnace with a temperature exceeding the glass transition temperature of the glass 45 (approximately 900 degrees Celsius). As the glass 45 is heated, it would be pressed up against the metal frames 41. At these temperatures, the glass 45 would begin to melt, such that as it is pressed up against the frames 41, it would ooze through the aperture 39 in each frame 41, completely filling each aperture 39 and extending out the opposite side of the frames 41. Upon cooling, the frames 41 would be melded with the sheet of glass 45, fused together to form hermetically sealed windows 40. The mechanical interlock holes 35 may also function to interlock the glass 45 with the metal frames 41 after fusing (since glass would ooze through these holes as well), in order to minimize thermal stress and maintain window integrity during any subsequent thermal processes.

Once the glass 45 has been fused to the metal frames 41, forming a hermetic seal between the two elements of the windows 40, the entire sheet of windows 40 may be polished on both sides to provide the necessary optical qualities for light transmission. Typically, the heat of the fusing process ruins the finish of the windows' glass 45. In addition, the glass 45 may need to be ground flat to provide a surface substantially flush with the frame 41 for the window 40. So the glass 45 may be ground to the appropriate level and polished on both sides to provide the desired optical characteristics. Step C of FIG. 3 illustrates this stage of the process. A typical example of the optical characteristics for a DMD window 40 would be a surface quality with scratches less than 40 micrometers in width and digs less than 20 micrometers in diameter. Economies of scale may be introduced by batch polishing the plurality of windows. Thus, a single grinding/polishing step may address a multitude of windows simultaneously.

Figure 4:
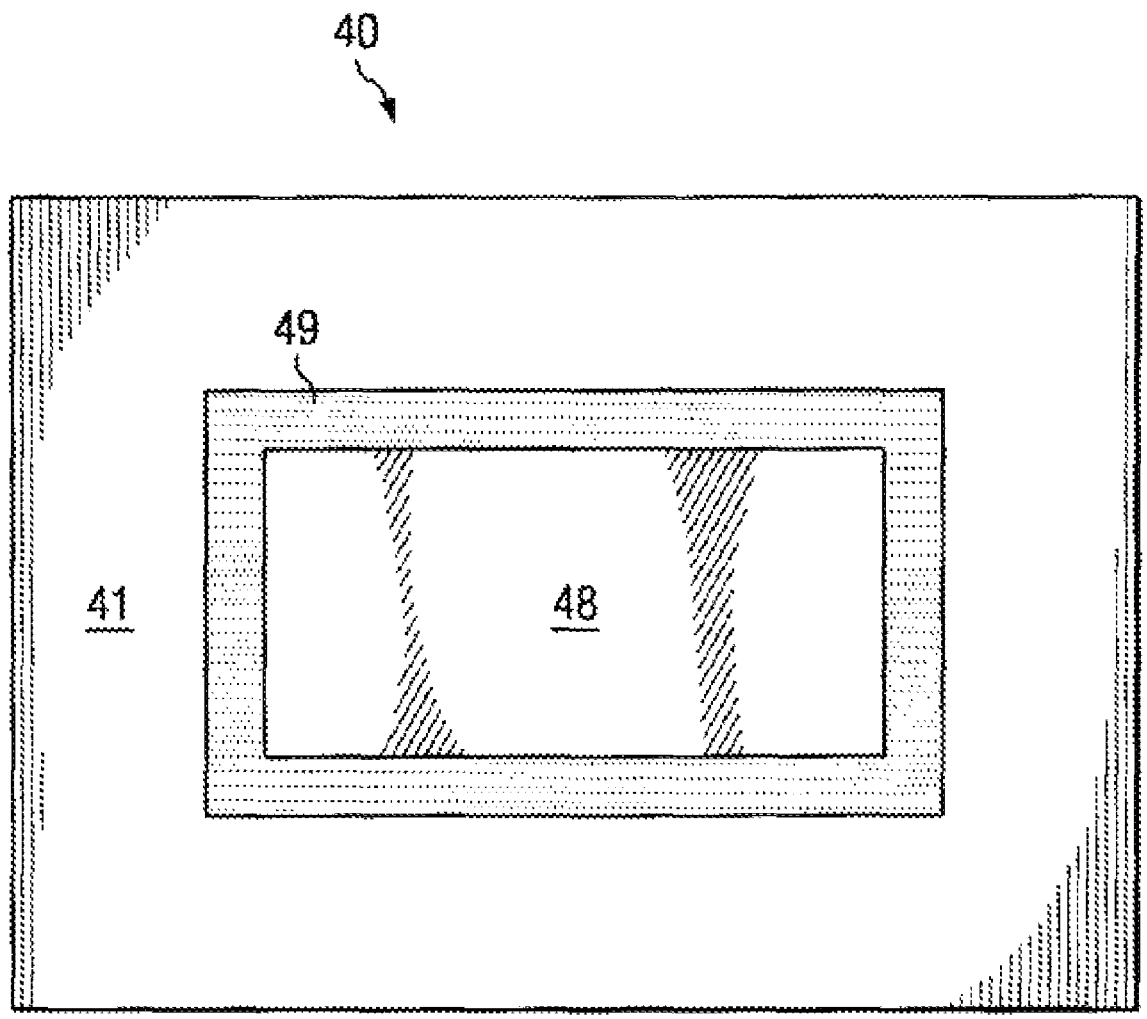
FIG. 4 is a plan view of an exemplary DMD window.

Next, any desired coatings, such as anti-reflective or anti-refractive coatings for the glass 45 or gold plating for the metal frame 41, may be applied simultaneously to all of the windows 40 in the grid 30. Again, using a batch coating technique may introduce economies of scale, making the application of various finishes more efficient. By way of example, a low reflectance coating may be applied on the inside surface of the glass 45. A photomask may then be applied to the glass 45 over the aperture 39, which then may be removed or etched away to form a clear glass aperture 48 (and generally the clear glass aperture 48 would be smaller than the aperture 39 within the metal frame, as shown in FIG. 4). As the exemplary DMD window of FIG. 4 illustrates, the photomask process may be used to form a clear glass aperture 48 over the aperture 39 in the metal frame 41, allowing light of the correct wavelength to penetrate into the DMD package. Typically, a dark, absorptive border 49 would be left surrounding the clear glass aperture 48 (for example, by removing only the portion of the photomask directly above the DMD active elements 22). This dark border 49 would then act to prevent light reflected from the non-optical elements of the DMD package from exiting the window 40, so that only light that is intentionally reflected by the DMD would exit through the window.

Anti-reflective coatings may also be applied to each side of the glass 45. The goal of such a coating process would be to provide effective light transmittance (of the appropriate wavelengths) through the window 40 to the DMD 22, typically greater than 98% with a reflectance less than 0.5%. The metal frame 41 could also be coated with protective layers. By way of example, a Kovar frame 41 may be plated with 100-300 micro-inches of nickel and fifty or more micro-inches of gold. Alternatively, the desired coatings described above may be applied at a later stage, after any cutting takes place, to reduce the risk of damage during the cutting process. The exemplary coatings described above are illustrative only and do not form an exclusive list. A person skilled in the art field will readily appreciate alternatives, and these are all intended to be included within the scope of this step.

The individual windows 40 typically would be cut from the grid 30 at a stage following the polishing and application of coatings. Step D of FIG. 3 illustrates this cutting step, when the individual windows 40 are separated out from the whole. The windows 40 usually would only be singulated once all of the processes that can be performed on a batch of windows 40 simultaneously have been completed. Alternatively, the windows 40 may be singulated after fusing (and before either polishing or applying coats), so long as the windows 40 are held in place within a grid-like structure 30 so that batch processing may take place.

The individual window elements 40 may be cut 47 free of the overall grid-like structure 30 with a saw, or they may be sheared off. If individual metal frames 41 were used, then the singulation process would involve cutting or shearing the glass sheet 45 at locations near the edge of the frame (typically in proximity to the grooves 43). On the other hand, if a sheet of metal with several apertures 39 serves to form the plurality of metal frames 41 for the windows 40, then both the glass 45 and the metal frame sheets 41 will have to be cut or sheared to form the individual window units 40. Again, such cuts 47 would typically be located in proximity to the grooves 43. Generally, the cuts 47 may completely penetrate the glass sheet 45, meeting the grooves 43 (and connectors 42 between the metal frames 41 or mechanical interlock holes 35 may then hold the frames 41 in place within the grid-like structure 30). If there are no grooves 43, then the cuts 47 would be located in proximity to the outside edges of the frames 41. In this case, a strip of glass may be removed from the outer lip of each frame 41 either before or after the cutting stage, by grinding for example, in order to provide an all-metal lip (on both sides) that may serve as an effective surface for seam welding the window 40 in place atop the package 20 In a typical exemplary welding process, the all-metal lip of the frame 41 of the window 40 would be placed in contact with the Kovar surface (in the form of a seal ring) of the package 20. Then a copper roller conducting electricity, for example, might roll over the upper surface of the metal frame 41, electrically heating the contacting metal surfaces of the lip and the package 20 to weld the window in place on the package 20.

If the glass sheet 45 is to be cut with a saw, a protective coating may be applied prior to the cutting stage in order to prevent the surface of the glass from being damaged by saw debris. Or, the glass sheet 45 could be protected by cover plates, tape, or resist. Alternatively, the saw process itself may be optimized to minimize surface damage during sawing. After the cutting stage, the windows 40 may need to be cleaned, removing any saw debris and ensuring that the windows 40 are relatively free of any contaminants that could affect the performance of the active elements of the micro-device (such as DMD micromirrors 22).

A protective cover 50 may also be applied to shield the windows 40 from the possibility of damage during shipping and handling, as shown in step E of FIG. 3. Such a protective cover 50 would ensure that the windows 40 were not damaged by handling and/or shipping prior to being mounted upon the DMD packages 20. Such a protective cover 50 may not be necessary, however, if the windows 40 are batch welded onto packages 20 prior to shipping. Such a batch welding process could take place either before or after the cutting stage. For batch welding, the windows 40 would be located in a grid 30 that would correspond to the placement of a matching number of packages 20. As the grid 30 of windows 40 is placed atop the matching packages 20, the metal frame 41 would make contact with the surface of the package 20 for welding, allowing a hermetically sealed container to be formed around the active elements of the micro-device 22. A getter 24 may also be optionally attached to the bottom of each window frame 41, such that when the window 40 is welded to its package 20, the getter 24 would be located inside the hermetically sealed container. The use of a getter 24 may further reduce the risk of environmental contamination interfering with the active elements of the micro-device 22, by eliminating the gases from within the sealed device.

The processes described above would allow several steps of the manufacturing process to be performed simultaneously for multiple windows 40, thereby reducing the time and labor necessary to produce each window 40. In addition, steps required for individual window formation, such as glass rounding and Kovar machining, may no longer be required. While batch processing may be used on any number of windows, typically such batch processing techniques might be used for ten-by-ten or fifteen-by-fifteen grids 30 of metal frames, allowing effective economies of scale to take place. Consequently, the described batch processing techniques may allow for more cost-effective manufacturing of windows.

While various embodiments in accordance with the principles disclosed herein have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages. It should also be noted that the figures set forth in conjunction with the description, and all of the elements shown therein, may not be drawn to scale, as they are intended solely for illustrative purposes. Any reference to a DMD is intended broadly, including any optical MEMS device. And while examples may make specific reference to DMDs and Optical MEMS windows, disclosed embodiments are not so limited; produced windows may be used with an assortment of micro-devices.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Field of the Invention," such claims should not be limited by the language chosen under this heading to describe the so-called technical field. Further, a description of a technology in the "Background of the Invention" section is not to be construed as an admission that technology is prior art to any invention(s) in this disclosure. Neither is the "Summary of the Invention" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What we claim is:

1. A method of making package windows, comprising:
   forming a plurality of metal frames, each frame having an aperture surrounded by a lip;
   forming a plurality of grooves in a sheet of glass; and
   joining the plurality of metal frames to a sheet of glass such that the sheet of glass spans multiple apertures to form a plurality of windows and the grooves correspond to the lips.

2. The method of claim 1, wherein the joining comprises forcing portions of the sheet of glass from a first side of the metal frame through at least one of the apertures to a second side of the metal frame.

3. The method of claim 1, wherein the joining comprises heating the sheet of glass at least to a transition temperature and forcing portions of the sheet of glass from a first side of the metal frame through at least one of the apertures to a second side of the metal frame.

4. The method of claim 1, wherein the joining comprises heating the sheet of glass to at least 900° C. and forcing portions of the sheet of glass from a first side of the metal frame through at least one of the apertures to a second side of the metal frame.

5. The method of claim 1, comprising placing an anti-fusing substance in at least a portion of the grooves.

6. The method of claim 5, the anti-fusing substance selected from the group consisting of insert salt, graphite, gypsum, and magnesium oxide.

7. A method of making package windows, comprising:
   forming a plurality of metal frames, each frame having an aperture surrounded by a lip;
   oxidizing a portion of the metal frame such that at least one side of the lip does not have an oxide coating; and
   joining the plurality of metal frames to a sheet of glass such that the sheet of glass spans multiple apertures to form a plurality of windows.

8. The method of claim 7, wherein the joining comprises forcing portions of the sheet of glass from a first side of the metal frame through at least one of the apertures to a second side of the metal frame.

9. The method of claim 7, wherein the joining comprises heating the sheet of glass at least to a transition temperature and forcing portions of the sheet of glass from a first side of the metal frame through at least one of the apertures to a second side of the metal frame.

10. The method of claim 7, wherein the joining comprises heating the sheet of glass to at least 900° C. and forcing portions of the sheet of glass from a first side of the metal frame through at least one of the apertures to a second side of the metal frame.

11. The method of claim 7, the oxidizing comprising oxidizing a portion of the metal frame and removing the oxidization from the at least one side of the lip.

* * * * *